United States Patent
Sumi

(10) Patent No.: US 8,459,767 B2
(45) Date of Patent: Jun. 11, 2013

(54) LIQUID EJECTING HEAD, LIQUID EJECTING APPARATUS, AND ACTUATOR

(75) Inventor: Koji Sumi, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 236 days.

(21) Appl. No.: 12/757,519

(22) Filed: Apr. 9, 2010

(65) Prior Publication Data

US 2010/0259574 A1 Oct. 14, 2010

(30) Foreign Application Priority Data

Apr. 14, 2009 (JP) .................................. 2009-098460

(51) Int. Cl.
*B41J 29/38* (2006.01)
(52) U.S. Cl.
USPC .................................. 347/10; 347/11; 347/13
(58) Field of Classification Search
USPC .......................................... 347/10, 11, 5, 9, 13
See application file for complete search history.

(56) References Cited

U.S. PATENT DOCUMENTS 7,055,921 B2 * 6/2006 Sumi .............................. 347/10

FOREIGN PATENT DOCUMENTS

JP 2005-119166 A 5/2005

\* cited by examiner

*Primary Examiner* — Lam S Nguyen
(74) *Attorney, Agent, or Firm* — Workman Nydegger

(57) ABSTRACT

A liquid ejecting head includes a flow path forming substrate in which pressure generation chambers are formed. The pressure generation chambers communicate with nozzles that eject liquid droplets. Piezoelectric elements are positioned on the flow path forming substrate to generate pressure changes in the pressure generation chambers. Each piezoelectric element includes a piezoelectric body layer, a first electrode on one side of the piezoelectric body layer, and a second electrode on the opposite side of the piezoelectric body layer. The piezoelectric element is driven in a condition that the relationship between minimum voltage $V_{min}$ and maximum voltage $V_{max}$, which are applied to the piezoelectric element, and peak voltage $V_o$ satisfies the expression, $V_{min}<V_o<V_{max}$. In this expression, the peak voltage $V_o$ is a voltage value at which a primary differential coefficient of displacement by voltage, which is obtained from a displacement-voltage curve, is at a maximum value.

9 Claims, 5 Drawing Sheets

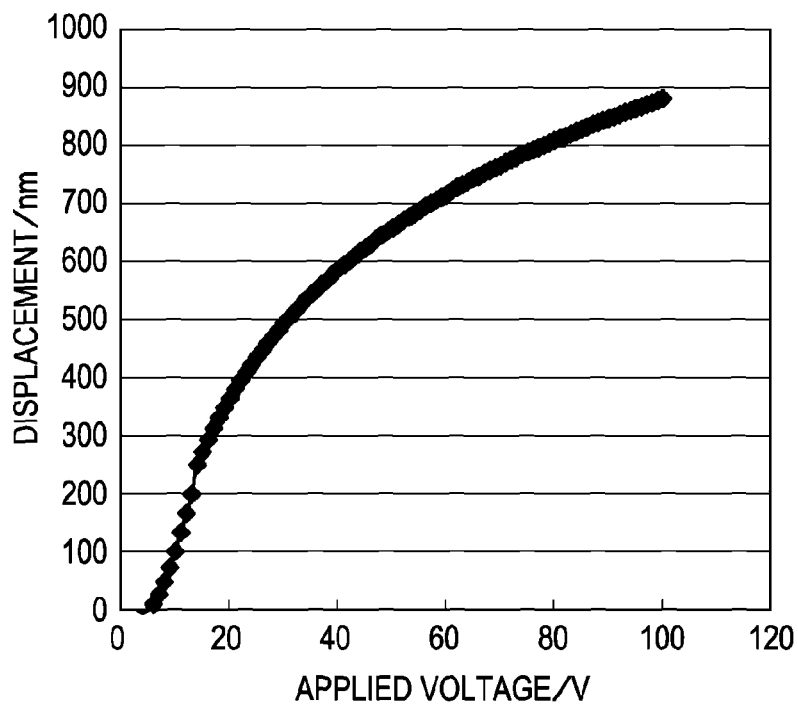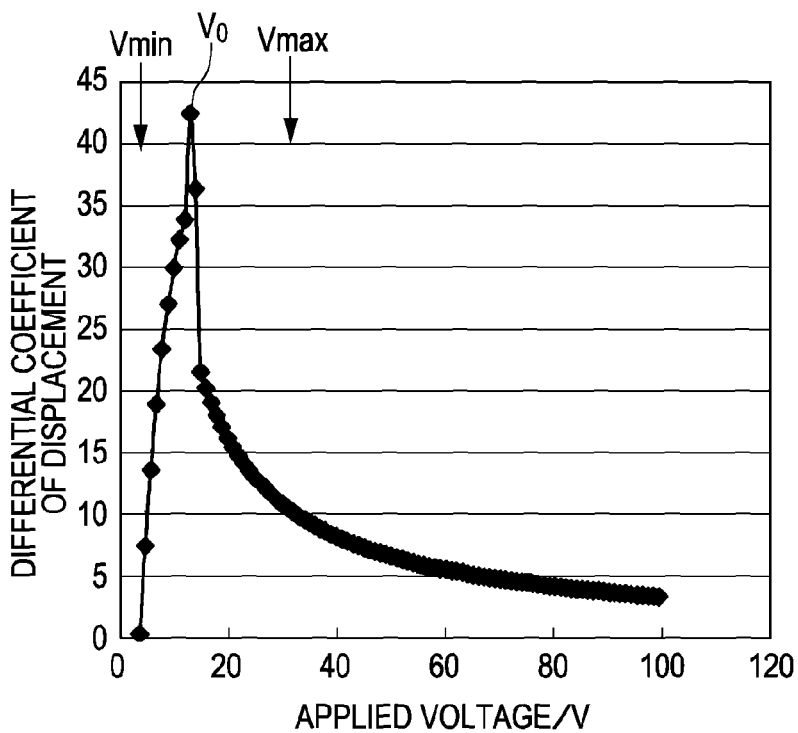

LIQUID EJECTING HEAD, LIQUID EJECTING APPARATUS, AND ACTUATOR

BACKGROUND

1. Technical Field

The present invention relates to a liquid ejecting head and a liquid ejecting apparatus, which eject liquid droplets from nozzles by the displacement of piezoelectric elements, and an actuator which is provided with a piezoelectric element.

2. Related Art

As a representative example of a liquid ejecting head, an ink jet type recording head which ejects an ink droplet from a nozzle by generating pressure in a pressure generation chamber by a pressure generation section can be given. As the pressure generation section constituting the ink jet type recording head, a piezoelectric element in which a piezoelectric body layer made of a piezoelectric material expressing an electromechanical conversion function is interposed between two electrodes can be given as an example, and the ink droplet is ejected from the nozzle by providing pressure into the pressure generation chamber by flexing and deforming the piezoelectric element.

Also, as for a material of the piezoelectric body layer which is used in the piezoelectric element, for example, a material having a perovskite structure, such as PZT is suitably used. Also, in a case where the piezoelectric body layer is formed of such a material, the piezoelectric body layer is mainly constituted of a crystal of a rhombohedral system or a tetragonal system. For example, there is a piezoelectric element in which the composition Zr/Ti of zirconia and titanium, which are contained in a piezoelectric body layer, is adjusted, and also a crystal thereof is a tetragonal system (for example, refer to JP-A-2005-119166).

In this manner, by adjusting the composition, the crystal system, or the like of the piezoelectric body layer, it is possible to improve a piezoelectric characteristic of the piezoelectric body layer, and therefore, it is possible to improve a displacement characteristic of the piezoelectric element.

However, there is a problem that just with adjustment of the composition or the crystal system of the piezoelectric body layer, there is a limit on improvement in the piezoelectric characteristic, so that a displacement characteristic of the piezoelectric element cannot be sufficiently improved. Also, in recent years, further improvement in displacement characteristic of the piezoelectric element is desired, and it is becoming hard to satisfy the demand.

Also, such a problem exists in not only the piezoelectric element which is used in the ink jet type recording head, but also in a piezoelectric element which is used in a liquid ejecting head which ejects other liquid droplets, and in addition, the problem also exists likewise in an actuator which is used in a device other than the liquid ejecting head.

SUMMARY

An advantage of some aspects of the invention is that it provides a liquid ejecting head, a liquid ejecting apparatus, and an actuator, which have an improved displacement characteristic of a piezoelectric element.

According to a first aspect of the invention, there is provided a liquid ejecting head including: a flow path forming substrate in which pressure generation chambers which are communicated with nozzles which eject liquid droplets are formed; and piezoelectric elements which are provided on the flow path forming substrate so as to generate pressure changes in the pressure generation chambers, wherein each piezoelectric element is constituted by a piezoelectric body layer, a first electrode which is provided on one side of the piezoelectric body layer, and a second electrode which is provided on the opposite side of the piezoelectric body layer, and the piezoelectric element is driven in a condition that the relationship between minimum voltage Vmin and maximum voltage Vmax, which are applied to the piezoelectric element, and peak voltage Vo satisfies the following expression 1, $$Vmin < Vo < Vmax \qquad (1),$$

in the above expression 1, the peak voltage Vo is a voltage value at which a primary differential coefficient of displacement by voltage, which is obtained from a displacement-voltage curve, is at a maximum value.

In the first aspect of the invention, the piezoelectric element can be efficiently displaced by using a range of voltage in which a rate of change of the amount of displacement of the piezoelectric element is large. Therefore, an ejection characteristic of an ink droplet can be improved.

Here, it is preferable that the minimum voltage Vmin be set to be a smaller value than the peak voltage Vo within the extent that the maximum voltage Vmax is larger than the peak voltage Vo. In this way, the piezoelectric element can be further efficiently displaced.

Further, it is preferable that the piezoelectric body layer be formed of a material having a perovskite structure, for example, lead zirconate titanate (PZT). In particular, it is preferable that a crystal structure of the piezoelectric body layer be a rhombohedral system. In this way, a displacement efficiency of the piezoelectric body layer at the time of the application of given voltage is further improved. Therefore, the piezoelectric element can be further efficiently displaced.

According to a second aspect of the invention, there is provided a liquid ejecting apparatus including: a liquid ejecting head including a flow path forming substrate in which pressure generation chambers which are communicated with nozzles which eject liquid droplets are formed, and piezoelectric elements which are provided on the flow path forming substrate so as to generate pressure changes in the pressure generation chambers, wherein each piezoelectric element is constituted by a piezoelectric body layer, a first electrode which is provided on one side of the piezoelectric body layer, and a second electrode which is provided on the opposite side of the piezoelectric body layer; and a driving section which drives the piezoelectric element in a condition that the relationship between minimum voltage Vmin and maximum voltage Vmax, which are applied to the piezoelectric element, and peak voltage Vo satisfies the following expression 1, $$Vmin < Vo < Vmax \qquad (1),$$

in the above expression 1, the peak voltage Vo is a voltage value at which a primary differential coefficient of displacement by voltage, which is obtained from a displacement-voltage curve, is at a maximum value.

In the second aspect of the invention, the piezoelectric element can be efficiently displaced by using a range of voltage in which a rate of change of the amount of displacement of the piezoelectric element is large. Therefore, an ejection characteristic of an ink droplet can be improved.

According to a third aspect of the invention, there is provided an actuator including: a piezoelectric element including a piezoelectric body layer, a first electrode which is provided on one side of the piezoelectric body layer, and a second electrode which is provided on the opposite side of the piezoelectric body layer, wherein the piezoelectric element is driven in a condition that the relationship between minimum voltage Vmin and maximum voltage Vmax, which are applied to the piezoelectric element, and peak voltage Vo satisfies the following expression 1, $$Vmin < Vo < Vmax \qquad (1),$$

in the above expression 1, the peak voltage Vo is a voltage value at which a primary differential coefficient of displacement by voltage, which is obtained from a displacement-voltage curve, is at a maximum value.

In the third aspect of the invention, the piezoelectric element can be efficiently displaced by using a range of voltage in which a rate of change of the amount of displacement of the piezoelectric element is large.

BRIEF DESCRIPTION OF THE DRAWINGS

The invention will be described with reference to the accompanying drawings, wherein like numbers reference like elements.

FIG. 3 is a graph showing the relationship between applied voltage to a piezoelectric element and displacement.

FIG. 4 is a graph showing the relationship between applied voltage to a piezoelectric element and a differential coefficient of displacement.

DESCRIPTION OF EXEMPLARY EMBODIMENTS

Hereinafter, the invention will be explained in detail on the basis of embodiments.

Embodiment 1

Figure 1:
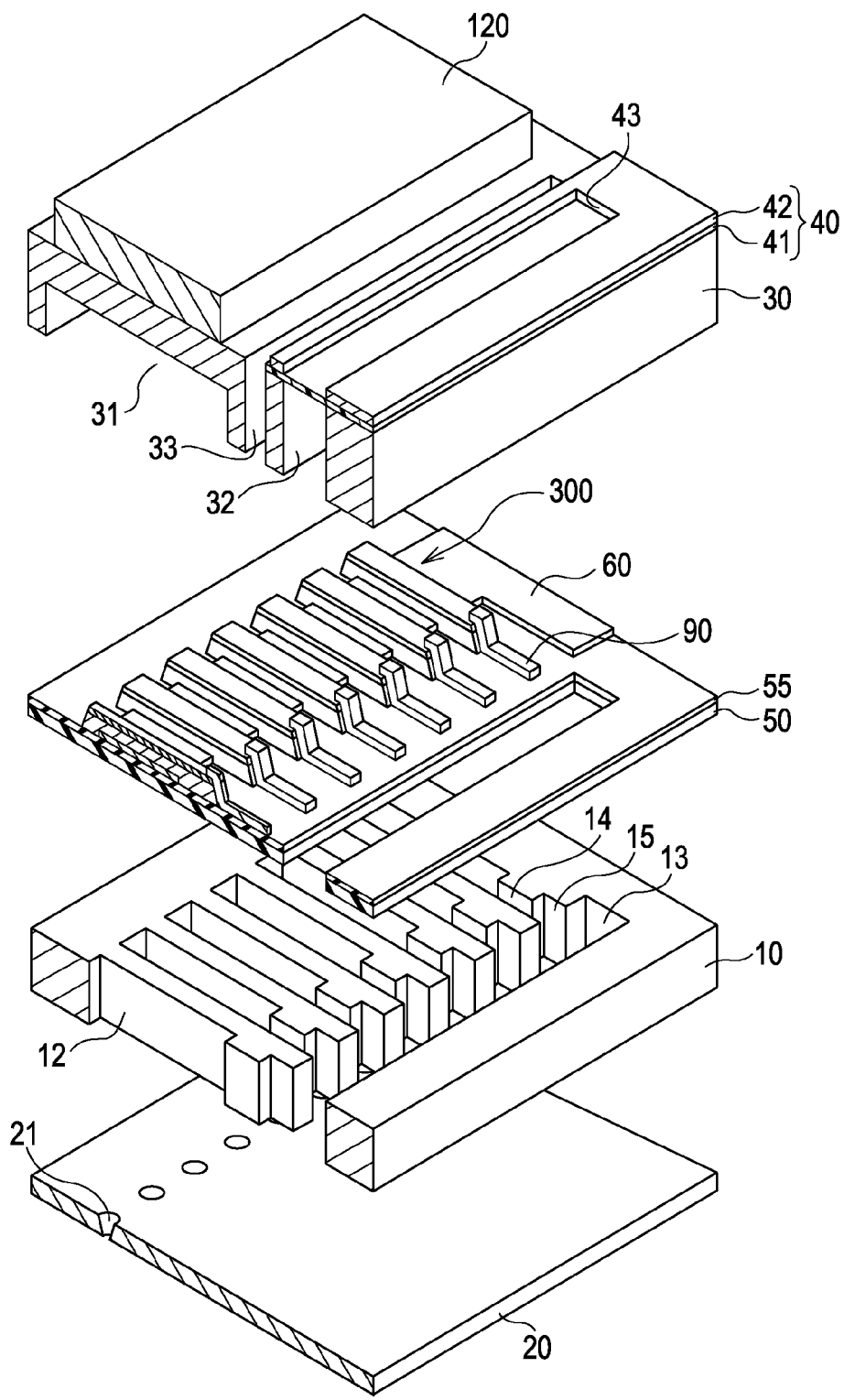
FIG. 1 is a perspective view showing a breakdown of the schematic configuration of a recording head concerning Embodiment 1.
Figure 2A:
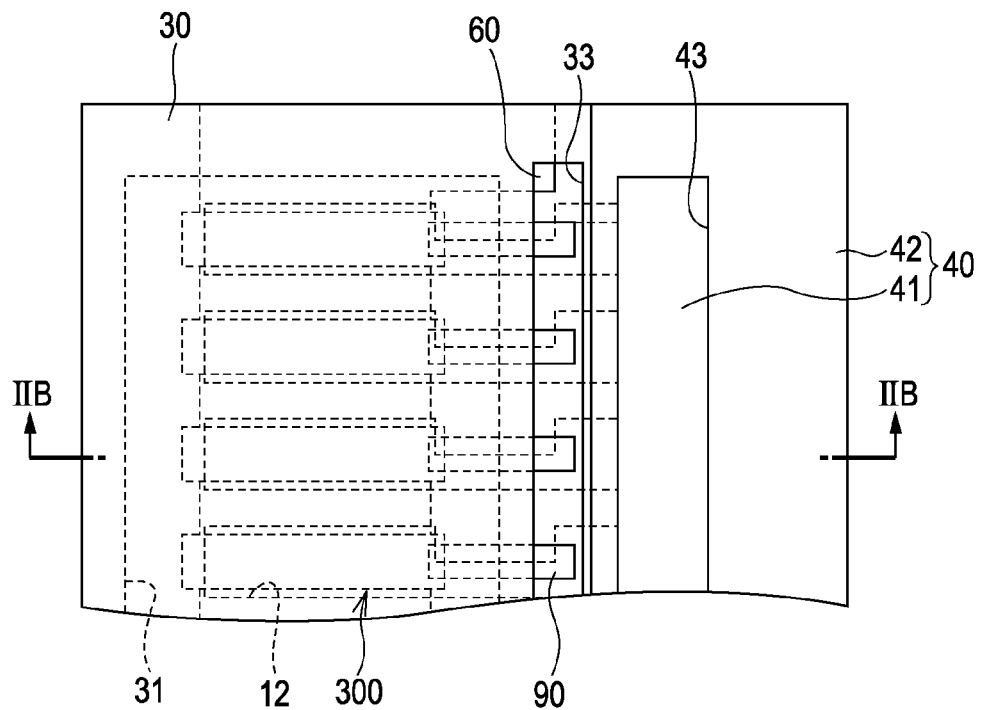
FIGS. 2A and 2B are a plan view and a cross-sectional view of the recording head concerning Embodiment 1.
Figure 2B:
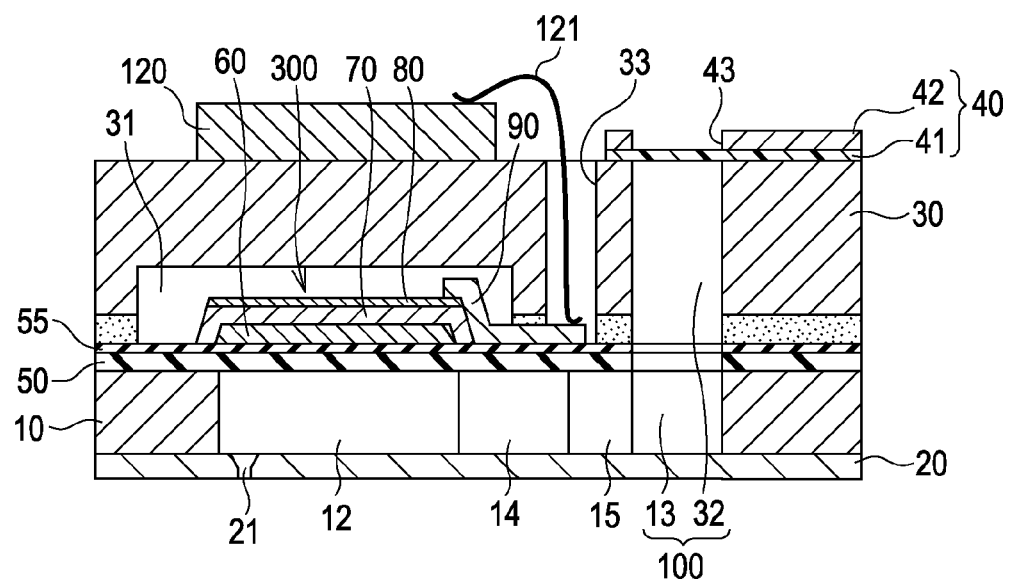

FIG. 1 is a perspective view showing a breakdown of the schematic configuration of an ink jet type recording head which is one example of a liquid ejecting head concerning Embodiment 1 of the invention, and FIGS. 2A and 2B are a plan view and a cross-sectional view in a longitudinal direction and a width direction of a pressure generation chamber of the ink jet type recording head.

A flow path forming substrate 10 constituting the ink jet type recording head is made of, for example, a silicon single crystal substrate having a face orientation (110), and a plurality of pressure generation chambers 12 are provided in parallel in a width direction (a short side direction) of the substrate, as shown in FIGS. 1, 2A and 2B. Also, a communicating portion 13 is formed in the region of the flow path forming substrate 10 outside in the longitudinal direction of the pressure generation chamber 12, and the communicating portion 13 and each pressure generation chamber 12 are communicated with each other through an ink supply path 14 and a communication path 15, which are provided for every pressure generation chamber 12. The communicating portion 13 is communicated with a reservoir portion 32 of a protective substrate, which will be described later, thereby constituting a portion of a reservoir 100 which serves as a common ink chamber to the pressure generation chambers 12. The ink supply path 14 plays a role of keeping constant a flow path resistance of ink which flows from the communicating portion 13 into the pressure generation chamber 12 and, in this embodiment, is formed into a narrower width than that of the pressure generation chamber 12.

In addition, a nozzle plate 20, in which nozzles 21 each communicated with each pressure generation chamber 12 are provided in a row, is joined on one face side of the flow path forming substrate 10 by an adhesive agent, a hot-melt film, or the like. Also, the nozzle plate 20 is made of, for example, glass ceramics, silicon single crystal substrate, stainless steel, or the like.

On the other hand, an elastic film 50 made of an oxide film is formed on the face of the flow path forming substrate 10 on the opposite side to the nozzle plate 20, and an insulator film 55 made of an oxide film which is a different material from that of the elastic film 50 is formed on the elastic film 50. In addition, piezoelectric elements 300, which are each constituted by a first electrode 60, a piezoelectric body layer 70, and a second electrode 80, are formed on the insulator film 55. In general, any one side electrode of the electrodes of the piezoelectric element 300 is made to be a common electrode which is common to a plurality of piezoelectric elements 300, and the other side electrode is patterned together with the piezoelectric body layer 70 in a region, which faces each pressure generation chamber 12, thereby constituting an individual electrode. In this embodiment, the first electrode 60 is set to be a common electrode to the piezoelectric elements 300 and the second electrode 80 is set to be an individual electrode of the piezoelectric element 300. However, the arrangement may be reversed in accordance with the conditions of a driving circuit or a wiring.

In addition, such a piezoelectric element 300 and a vibration plate that is a portion which is displaced by the driving of the piezoelectric element 300 are collectively called an actuator. In the example described above, the elastic film 50, the insulator film 55, and the first electrode 60 serve as the vibration plate. However, the configuration of the vibration plate is not particularly limited, but, for example, a configuration may also be made such that the elastic film 50 and the insulator film 55 are not provided and only the first electrode 60 functions as the vibration plate. Also, for example, the piezoelectric element 300 itself may also substantially double as the vibration plate.

Here, as materials of the first and second electrodes 60 and 80 constituting the piezoelectric element 300, although it is not particularly limited, platinum (Pt), iridium (Ir), or the like can be given as an example. Also, the piezoelectric body layer 70 is made of a piezoelectric material exhibiting an electro-mechanical conversion action, for example, a ferroelectric material including Zr or Ti as metal having a perovskite structure, for example, a ferroelectric material such as lead zirconate titanate (PZT), a material in which metal oxide such as niobium oxide, nickel oxide, or magnesium oxide is added to the ferroelectric material, or the like. Specifically, lead zirconate titanate ($Pb(Zr,Ti)O_3$), barium zirconate titanate ($Ba(Zr,Ti)O_3$), lead lanthanum zirconate titanate (($Pb,La)(Zr,Ti)O_3$), zirconium lead titanate magnesium niobate ($Pb(Zr,Ti)(Mg,Nb)O_3$), or the like can be given as an example.

In addition, a crystal structure of the piezoelectric body layer 70 may be any of a rhombohedral system, a tetragonal system, and a monoclinic system, but the rhombohedral system is preferable. Also, the piezoelectric body layer 70 may also be preferentially oriented to any of a (100) plane, a (110) plane, and a (111) plane, but the piezoelectric body layer preferentially oriented to a (100) plane is preferable.

This is because a direction of a polarization moment corresponds to an engineered domain structure in which, when the direction is inclined at a constant angle with respect to an applied electric field direction, the amount of piezoelectric displacement is maximized. That is, if the piezoelectric body layer 70 is deformed by applying given voltage to the piezoelectric element 300, phase transition of a crystal of a rhombohedral system into a crystal of a tetragonal system occurs, and at that time, the amount of piezoelectric displacement is maximized. Therefore, the piezoelectric body layer 70 having such a crystal structure is excellent in displacement characteristic, so that the very large amount of displacement can be obtained by the application of given voltage, as will be described later.

Also, "preferential orientation" means a state where an orientation direction of a crystal is not disordered and a specific crystal face faces in an almost constant direction. For example, "is preferentially oriented to a (100) plane" means that the ratio of diffraction intensity of a (100) plane, a (110) plane, and a (111) plane, which occurs when a piezoelectric body layer is measured by a X-ray diffraction wide angle method, (100)/((100)+(110)+(111)), is larger than 0.5.

Also, in order to make the piezoelectric body layer 70 be preferentially oriented to a (100) plane or a (110) plane, the piezoelectric body layer can be formed by providing an orientation control layer having a given crystal orientation under or on the first electrode 60, or providing titanium or the like, which neutralizes the orientation, on the first electrode 60, and adjusting a heat treatment temperature at the time of the forming of the piezoelectric body layer 70. Also, with respect to the piezoelectric body layer 70 preferentially oriented to a (111) plane, for example, by directly forming the piezoelectric body layer on the first electrode 60 which is preferentially oriented to a (111) plane, the piezoelectric body layer 70 preferentially oriented to a (111) plane by epitaxial growth followed a crystalline property of the first electrode 60 can be formed.

Also, the piezoelectric body layer 70 can be formed by a sol-gel method, a MOD (Metal-Organic Decomposition) method, a sputtering method, a PVD (Physical Vapor Deposition) method such as a laser ablation method, or the like.

Also, a lead electrode 90, which is made of, for example, gold (Au) or the like, is drawn out from the vicinity of the end portion of the ink supply path 14 side, and extends onto the insulator film 55, is connected to each second electrode 80 which is the individual electrode of the piezoelectric element 300.

A protective substrate 30 having a piezoelectric element retention portion 31 which is a space for protecting the piezoelectric elements 300 is joined on the flow path forming substrate 10 in which the piezoelectric elements 300 are formed. Also, the reservoir portion 32 is provided in the protective substrate 30, and the reservoir portion 32 constitutes the reservoir 100 which is communicated with the communication portion 13 of the flow path forming substrate 10, thereby serving as a common ink chamber to the pressure generation chambers 12, as described above. Also, a through-hole 33 which penetrates the protective substrate 30 in the thickness direction is provided in the protective substrate 30, and an end portion of the lead electrode 90 drawn out from each piezoelectric element 300 is provided so as to be exposed in the through-hole 33.

A driving circuit 120 which is a driving section for driving the piezoelectric elements 300 is fixed on the protective substrate 30, and the driving circuit 120 and the lead electrode 90 are electrically connected to each other through a connection wiring 121 which is made of an electrically-conductive wire such as a bonding wire. Also, a compliance substrate 40 which is constituted by a sealing film 41 and a fixing plate 42 is joined on the protective substrate 30. The sealing film 41 is made of a material having flexibility and low rigidity, and one side face of the reservoir portion 32 is sealed by the sealing film 41. The fixing plate 42 is formed of a relatively hard material. The region of the fixing plate 42 facing the reservoir 100 is formed as an opening portion 43 in which the fixing plate was completely removed in the thickness direction, so that one side face of the reservoir 100 is sealed by only the sealing film 41 having flexibility.

In the ink jet type recording head of this embodiment having a configuration as described above, ink is introduced from an ink introduction port connected to an external ink supply section, the internal portion extending from the reservoir 100 to the nozzle 21 is filled with ink, and thereafter, the pressure in each pressure generation chamber 12 is increased by the flexure-deformation of the piezoelectric element 300 by the application of voltage to each piezoelectric element 300 corresponding to the pressure generation chamber 12 in accordance with a recording signal from the driving circuit 120, so that an ink droplet is ejected from the nozzle 21.

Also the piezoelectric element 300 according to the invention, which is mounted in such an ink jet type recording head, is driven in a condition that minimum voltage Vmin and maximum voltage Vmax, which are applied to the piezoelectric element 300 at the time of driving, satisfy the following expression 1, as explained below. That is, setting is made such that voltage (the minimum voltage Vmin and the maximum voltage Vmax) which is applied to the piezoelectric element 300 by the driving circuit 120 which is the driving section satisfies the relationship of the following expression 1.

$$Vmin < Vo < Vmax \tag{1}$$

In the above expression 1, peak voltage Vo is a voltage value at which a primary differential coefficient of displacement by voltage, which is obtained from a displacement-voltage curve, is at a maximum value.

Specifically explaining, the amount of displacement of the piezoelectric element 300 exhibits a tendency to increase in accordance with the increase in voltage which is applied to the piezoelectric element 300, as shown in FIG. 3. As is apparent from the graph, a rate of change (gradient) of the amount of displacement in relation to voltage which is applied to the piezoelectric element 300 is not constant, but sequentially varies. Also, calculating a primary differential coefficient (rate of change) of the amount of displacement on the basis of the results of the graph of FIG. 3, the results as shown in FIG. 4 are obtained. That is, a primary differential coefficient (rate of change) of the amount of change of the piezoelectric element 300 sharply rises until it reaches the peak voltage Vo in accordance with the increase in voltage which is applied to the piezoelectric element 300, and thereafter, is decreased, as shown in FIG. 4.

Therefore, in the invention, the minimum voltage Vmin which is applied to the piezoelectric element 300 is set to be a smaller value than the peak voltage Vo, and the maximum voltage Vmax which is applied to the piezoelectric element 300 is set to be a larger value than the peak voltage Vo. That is, voltage which is applied to the piezoelectric element 300 is set to satisfy the relationship of the above expression 1. In this way, it is possible to efficiently displace the piezoelectric element 300 by using a range of voltage in which a rate of change of the amount of displacement of the piezoelectric element 300 is large. Therefore, an ejection characteristic of an ink droplet can be improved.

Also, in this manner, it is possible to efficiently displace the piezoelectric element 300. Therefore, for example, even in a case where unevenness exists in piezoelectric characteristics of the piezoelectric elements 300 between the heads, so that it necessary to adjust the applied voltage, it is possible to easily make the amount of displacement of the piezoelectric element 300 uniform by finely adjusting voltage.

Figure 5:
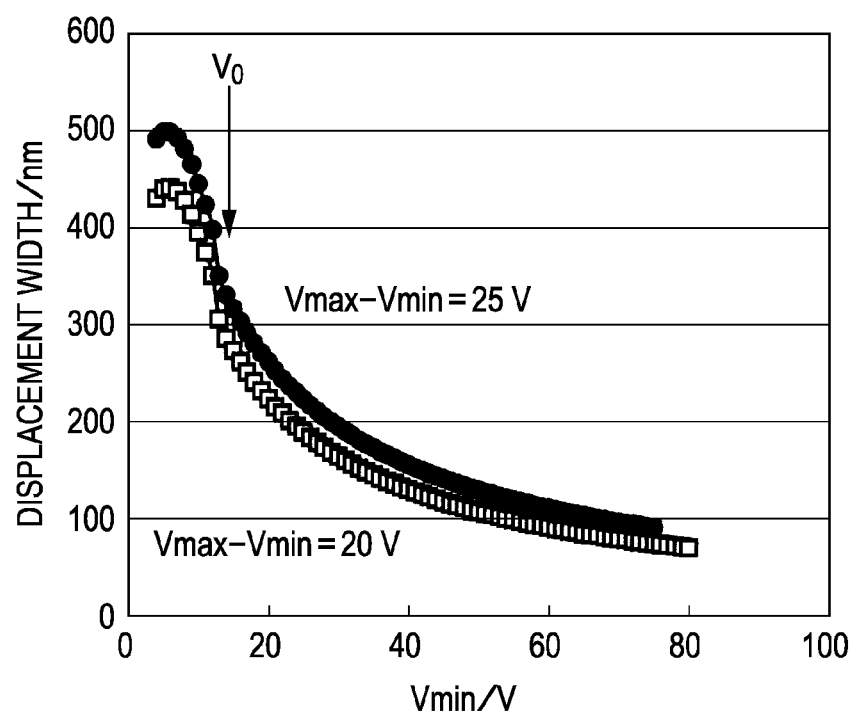
FIG. 5 is a graph showing the relationship between minimum voltage which is applied to a piezoelectric element and a displacement width.

Also, FIG. 5 shows the measurement results of differences (displacement widths) in the amount of displacement when the minimum voltage Vmin and the maximum voltage Vmax are applied to the piezoelectric element 300 by making a voltage difference (Vmax−Vmin) between the minimum voltage Vmin and the maximum voltage Vmax, which are applied to the piezoelectric element 300, be constant values (for example, 20 V and 25 V). As shown in FIG. 5, in a case where the voltage difference is constant, despite the voltage differences of 20 V and 25 V, a tendency is exhibited in which basically, the smaller the minimum voltage Vmin, the larger the displace width, and as the minimum voltage Vmin becomes larger, the displace width is reduced.

Therefore, in a case where a voltage difference between the minimum voltage Vmin and the maximum voltage Vmax, which are applied to the piezoelectric element 300, is set to be a given value, it is preferable that an intermediate value of the voltage difference be smaller than the peak voltage Vo, and more preferably, the minimum voltage Vmin is set to be a smaller value than the peak voltage Vo within the extent that the maximum voltage Vmax is larger than the peak voltage Vo. In this way, it is possible to further efficiently displace the piezoelectric element 300.

Other Embodiments

Although one embodiment of the invention has been described above, of course, the invention is not to be limited to the above-described embodiment. In the above-described embodiment, the piezoelectric element 300 is defined by the relationship between the minimum voltage Vmin and the maximum voltage Vmax, which are applied to piezoelectric element, and the peak voltage Vo. However, the piezoelectric element may also be defined by, for example, the relationship between a minimum value of electric field strength (minimum electric field strength Emin) and a maximum value of the electric field strength (maximum electric field strength Emax), which are applied to the piezoelectric element 300, and peak electric field strength Eo. Incidentally, the peak electric field strength Eo is an electric field strength value at which a primary differential coefficient of distortion by electric field strength, which is obtained from a distortion-electric field strength curve, is at a maximum value.

That is, a configuration may also be made such that the piezoelectric element 300 is driven in a condition that the minimum electric field strength Emin and the maximum electric field strength Emax, which are applied to the piezoelectric element 300, satisfy the following expression 2.

$$\text{Emin} < \text{Eo} < \text{Emax} \quad (2)$$

The distortion-electric field strength curve substantially corresponds with the displacement-voltage curve. Therefore, the relationship between the minimum value of electric field strength (minimum electric field strength Emin) and the maximum value of the electric field strength (maximum electric field strength Emax), which are applied to the piezoelectric element 300, and the peak electric field strength Eo also substantially corresponds with the relationship between the minimum voltage Vmin and the maximum voltage Vmax and the peak voltage Vo. Therefore, when the minimum electric field strength Emin and the maximum electric field strength Emax, which are applied to the piezoelectric element 300, and the peak electric field strength Eo satisfy the relationship of the above expression 2, similarly to the case of the above-described embodiment, it is possible to efficiently displace the piezoelectric element 300 by using a range of electric field strength in which a rate of change of the amount of displacement of the piezoelectric element 300 is large.

Figure 6:
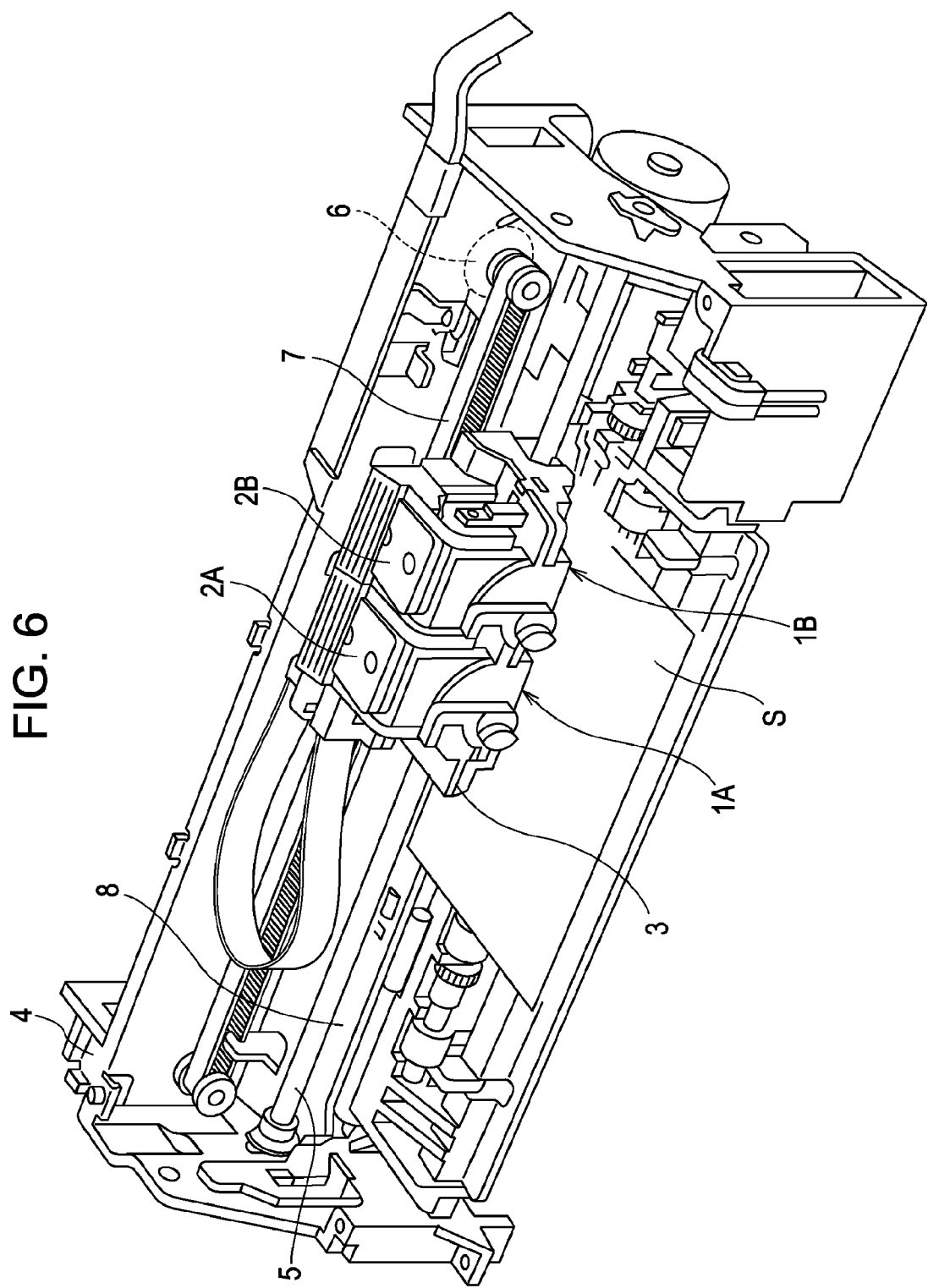
FIG. 6 is a view showing the schematic configuration of a recording apparatus concerning one embodiment.

In addition, the ink jet type recording head described above constitutes a portion of a recording head unit having ink flow paths which are communicated with ink cartridges and so on, and is mounted on an ink jet type recording apparatus. As shown in FIG. 6, cartridges 2A and 2B constituting ink supply sections are detachably mounted on recording head units 1A and 1B having the ink jet type recording heads, and a carriage 3 on which the recording head units 1A and 1B are mounted is provided to be movable in an axial direction on a carriage shaft 5 attached to an apparatus main body 4. The recording head units 1A and 1B respectively discharge, for example, a black ink composition and a color ink composition.

Also, the carriage 3 on which the recording head units 1A and 1B are mounted is moved along the carriage shaft 5 by the driving force of a drive motor 6, which is transmitted to the carriage 3 through a plurality of gears (not shown) and a timing belt 7. On the other hand, a platen 8 is provided along the carriage shaft 5 in the apparatus main body 4, and a recording sheet S, which is a recording medium such as paper fed by a paper feed roller (not shown) and so on, is wound around the platen 8 and transported.

Also, in the above-described embodiment, a configuration has been illustrated in which the driving circuit 120 which is a driving section is mounted on the ink jet type recording head. However, of course, the driving section may also be provided on the recording apparatus sid.

Further, in the above-described embodiment, the invention has been described by taking the ink jet type recording head and the liquid ejecting apparatus as examples of a liquid ejecting head and a liquid ejecting apparatus. However, the invention broadly targets liquid ejecting heads and liquid ejecting apparatuses in general, which are provided with the liquid ejecting head, and, of course, is also applicable to liquid ejecting heads which eject liquid other than ink. As other liquid ejecting heads, various recording heads used in an image recording apparatus such as a printer, a color material ejecting head used for the manufacturing of a color filter of a liquid crystal display or the like, an electrode material ejecting head used for the formation of the electrode of an organic EL (electroluminescence) display, a FED (Field Emission Display), or the like, a biological organic matter ejecting head used for the manufacturing of a biochip, or the like can be given as examples.

In addition, the invention can be applied to not only the liquid ejecting head typified by the ink jet type recording head, but also actuators which are mounted in other apparatuses.

What is claimed is:

1. A liquid ejecting head comprising:
    a piezoelectric element having a piezoelectric layer and electrodes;
    the piezoelectric element is driven in a condition that the relationship between minimum voltage Vmin and maximum voltage Vmax, which are applied to the piezoelectric element, and peak voltage Vo satisfies the following expression 1, $$\text{Vmin} < \text{Vo} < \text{Vmax} \quad (1),$$

in the above expression 1, the peak voltage Vo is a voltage value at which a primary differential coefficient of displacement by voltage, which is obtained from a displacement-voltage curve, is at a maximum value, wherein the primary differential coefficient of displacement increases from Vmin to Vo at a greater rate than the primary differential coefficient of displacement decreases from Vo to Vmax, and wherein when a voltage difference between the minimum voltage Vmin and the maximum voltage Vmax is set to a given value, an intermediate value of the voltage difference is smaller than the peak voltage Vo.

2. The liquid ejecting head according to claim 1, wherein the minimum voltage Vmin is set to be a smaller value than the peak voltage Vo within the extent that the maximum voltage Vmax is larger than the peak voltage Vo.

3. The liquid ejecting head according to claim 1, wherein the piezoelectric body layer is made of a material having a perovskite structure.

4. The liquid ejecting head according to claim 3, wherein a crystal structure of the piezoelectric body layer is a rhombohedral system.

5. The liquid ejecting head according to claim 1, wherein the piezoelectric layer contains lead zirconate titanate.

6. A liquid ejecting apparatus comprising:
a liquid ejecting head including a piezoelectric element having a piezoelectric layer and electrodes; and
a driving section which drives the piezoelectric element in a condition that the relationship between minimum voltage Vmin and maximum voltage Vmax, which are applied to the piezoelectric element, and peak voltage Vo satisfies the following expression 1, $$\text{Vmin} < \text{Vo} < \text{Vmax} \tag{1},$$

in the above expression 1, the peak voltage Vo is a voltage value at which a primary differential coefficient of displacement by voltage, which is obtained from a displacement-voltage curve, is at a maximum value, wherein the primary differential coefficient of displacement increases from Vmin to Vo at a greater rate than the primary differential coefficient of displacement decreases from Vo to Vmax, and wherein when a voltage difference between the minimum voltage Vmin and the maximum voltage Vmax is set to a given value, an intermediate value of the voltage difference is smaller than the peak voltage Vo.

7. The liquid ejecting apparatus according to claim 6, wherein the piezoelectric layer contains lead zirconate titanate.

8. An actuator comprising:
a piezoelectric element including a piezoelectric body layer, a first electrode which is provided on one side of the piezoelectric body layer, and a second electrode which is provided on the opposite side of the piezoelectric body layer;
wherein the piezoelectric element is driven in a condition that the relationship between minimum voltage Vmin and maximum voltage Vmax, which are applied to the piezoelectric element, and peak voltage Vo satisfies the following expression 1, $$\text{Vmin} < \text{Vo} < \text{Vmax} \tag{1},$$

in the above expression 1, the peak voltage Vo is a voltage value at which a primary differential coefficient of displacement by voltage, which is obtained from a displacement-voltage curve, is at a maximum value, wherein the primary differential coefficient of displacement increases from Vmin to Vo at a greater rate than the primary differential coefficient of displacement decreases from Vo to Vmax, and wherein when a voltage difference between the minimum voltage Vmin and the maximum voltage Vmax is set to a given value, an intermediate value of the voltage difference is smaller than the peak voltage Vo.

9. The actuator according to claim 8, wherein the piezoelectric body layer contains lead zirconate titanate.

* * * * *